(12) United States Patent
Lee

(10) Patent No.: US 6,649,955 B2
(45) Date of Patent: Nov. 18, 2003

(54) FERROELECTRIC MEMORY DEVICE AND METHOD OF FABRICATING THE SAME

(75) Inventor: Yong-Tak Lee, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/199,455

(22) Filed: Jul. 19, 2002

(65) Prior Publication Data

US 2003/0015741 A1 Jan. 23, 2003

(30) Foreign Application Priority Data

Jul. 21, 2001 (KR) ........................................ 2001-44055

(51) Int. Cl.$^7$ ............................................. H01L 31/119
(52) U.S. Cl. .................... 257/295; 257/296; 257/758
(58) Field of Search .................................. 257/295, 758, 257/296, 298, 763, 303, 300, 306; 438/637, 3

(56) References Cited

U.S. PATENT DOCUMENTS

| | | | | |
|---|---|---|---|---|
| 5,990,507 A | * | 11/1999 | Mochizuki et al. | 257/295 |
| 6,075,293 A | * | 6/2000 | Li et al. | 257/763 |
| 6,346,475 B1 | * | 2/2002 | Suzuki et al. | 438/637 |
| 6,485,988 B2 | * | 11/2002 | Ma et al. | 438/3 |

* cited by examiner

*Primary Examiner*—David Nelms
*Assistant Examiner*—Thinh T. Nguyen
(74) *Attorney, Agent, or Firm*—Marger Johnson & McCollom, P.C.

(57) ABSTRACT

A ferroelectric memory device and a method of fabricating the same are disclosed. Four interlayer dielectric layers are stacked on cell array and peripheral circuit regions on a semiconductor substrate. A gate contact pad and a source/drain contact pad are connected to a gate electrode and a source/drain of the peripheral circuit transistor through the first interlayer dielectric layer. A gate contact plug and a source/drain contact plug are respectively connected to the gate contact pad and the source/drain contact pad through the second interlayer dielectric layer. First via holes expose the gate contact plug and the source contact plug through the third interlayer dielectric layer. A first interconnection extends between the third and fourth interlayer dielectric layers, covering the sidewalls of the first via holes and connected to at least one of the gate contact plug and the source/drain contact plug.

14 Claims, 12 Drawing Sheets

FERROELECTRIC MEMORY DEVICE AND METHOD OF FABRICATING THE SAME

RELATED APPLICATION

This application relies for priority on Korean Patent Application No. 2001-44055, filed Jul. 21, 2001, the contents of which are incorporated by this reference.

BACKGROUND OF THE INVENTION

1. Field of the Invention

The present invention relates to a semiconductor device and a method of fabricating the same. More particularly, the present invention relates to a ferroelectric memory device and a method of fabricating the same.

2. Description of the Related Art

A ferroelectric memory device uses a ferroelectric material such as PZT $Pb(Zr_xTi_{1-x})O_3$ or BST ($BaSrTiO_3$) as a capacitor dielectric layer. The ferroelectric substance has a remnant polarization characteristic (Pr) different from a conventional dielectric substance such as oxide, silicon nitride and tantalum pentoxide. Thus, polarization is maintained even when external power is cut off and, as a result, data are retained.

Remnant polarization may be degraded during ferroelectric memory device fabrication e, g, the interconnection formation after the formation of a ferroelectric capacitor. When the interconnection is formed of a metal layer reflowed by heat treatment after deposition, the remnant polarization can be degraded by stress applied to the capacitor resulting from metal expansion. Forming the metal interconnection without reflow by thermal treatment reduces the stress and prevents degradation.

FIG. 1 is a hysteresis graph of a ferroelectric capacitor with respect to an interconnection process. The horizontal, or x-axis, shows the voltage applied to the capacitor and the vertical, or y-axis, indicates polarization per unit area of the capacitor. Line 1 is a hysteresis curve of a ferroelectric capacitor and illustrates case 1, in which the interconnection is formed of sputter-deposited aluminum, and line 2 is another hysteresis curve and illustrates case 2, in which the capacitor is made from aluminum reflowed by thermal treatment for 60 seconds at a temperature of 550° C. after deposition.

As illustrated, case 1 has higher polarization than case 2. Even after cutting off power, the remnant polarization of case 1 is higher than that of case 2. However, when a ferroelectric memory device is fabricated using the conventional method, the sputter-deposited metal interconnection is problematic.

FIGS. 2 through 5 illustrate cross-sectional views showing a conventional method of fabricating a ferroelectric memory device.

FIG. 2 illustrates a semiconductor substrate 100 with a cell array region, 'a,' having a cell transistor and a peripheral circuit region, 'b,' having a peripheral circuit transistor. A bit line pad 112 and a storage node contact pad 114 are connected to a cell source 106 and a cell drain 104, respectively. Then, a first interlayer dielectric layer 116 is formed over the surface of the resulting structure where the bit line pad 112 and the storage node contact pad 114 are formed. A bit line 124 is connected to the bit line pad 112 through the first interlayer dielectric layer 116. Concurrently, a source/drain contact pad 126 and a gate contact pad 128 are respectively connected to a source/drain 110 and a gate electrode 108 of the peripheral circuit transistor through the first interlayer dielectric layer 116.

FIG. 3 shows the formation of a second interlayer dielectric layer 130 over the surface of the resulting structure. A storage node contact plug 138 is connected to the storage node contact pad 114 through the first and second interlayer dielectric layers 116,130. A ferroelectric capacitor 150 is then connected to the storage node contact plug 138 on the second interlayer dielectric layer 130, and a third interlayer dielectric layer 152 is formed over the surface of the substrate where the storage node contact plug 138 is formed. The second and third interlayer dielectric layers 130, 152 are sequentially patterned to form first via holes 136 exposing the source/drain contact pad 126 and the gate contact pad 128.

Referring to FIG. 4 a first conductive layer is formed over the surface of the resulting structure. As described above, the first conductive layer is formed of a sputter-deposited metal layer so as not to degrade the capacitor dielectric layer. The first conductive layer is then patterned to form a first interconnection 156 selectively connected to the source/drain node contact pad 126 and the gate contact pad 128.

The first via hole 136 has high aspect ratio because it exposes the source/drain contact pad 126 and the gate contact pad 128 through the second and third interlayer dielectric layers 130, 152. Because of the high aspect ratio, a metal layer is improperly deposited on the sidewalls of the via hole 136 and thus the first interconnection 156 is cut off or not uniformly formed as indicated at 157, thereby increasing resistance. If the first conductive layer is formed of the sputter-deposited metal layer, the problem worsens.

FIG. 5 shows a fourth interlayer dielectric layer 158 formed over the surface of the resulting structure where the first interconnection 156 is formed. The third and fourth interlayer dielectric layers 152, 158 are sequentially patterned to form a plate electrode hole 160 exposing the ferroelectric capacitor 150 and forming a second via hole 162 exposing the first interconnection 156. Next, a second conductive layer is formed over the surface of the fourth interlayer dielectric layer 158. Like the first conductive layer, the second conductive layer may be formed of a sputter-deposited metal to prevent the degradation of the ferroelectric capacitor 150. The second conductive layer is then patterned to form a plate electrode line 164 connected to the ferroelectric capacitor 150 and concurrently forms a second interconnection 166 connected to the first interconnection 156. The plate electrode line 164 and the second interconnection 166 may be selectively connected to a desired region of the semiconductor substrate-100.

As described above, in order to prevent degrading the polarization of the ferroelectric capacitor, the interconnection may be formed of sputter-deposited aluminum. However, because the metal interconnection of a conventional ferroelectric device fills the sidewalls of the high aspect ratio via hole and is connected to a gate electrode and a source/drain of the peripheral circuit, when the interconnection is formed of the sputter-deposited metal the high aspect ratio causes the metal layer to be improperly deposited on the sidewalls of the via hole. Thus, the metal interconnection is cut off and resistance is increased, degrading reliability of the metal interconnection.

SUMMARY OF THE INVENTION

It is an object of the present invention to provide a ferroelectric memory device with increased metal interconnection reliability and decreased resistance by reducing the aspect ratio of the via hole, and a method of fabricating the same.

According to one embodiment of the present invention, the device includes a semiconductor substrate having a cell array region where at least one cell transistor is arranged and a peripheral circuit region where at least one peripheral circuit transistor is arranged. Four dielectric layers are sequentially stacked over the surface of the cell array region and the peripheral circuit region. A gate contact pad and a source/drain contact pad are respectively connected to a gate electrode and a source/drain of the peripheral circuit transistor through the first interlayer dielectric layer. A gate contact plug and a source/drain contact plug are respectively connected to the gate contact pad and the source/drain contact pad, through the second interlayer dielectric layer. First via holes expose the gate contact plug and the source/drain contact plug through a third interlayer dielectric layer.

A first interconnection is arranged to extend a desired region of the semiconductor substrate between the third and fourth interlayer dielectric layers. The first interconnection may be selectively connected to the gate contact plug or the source/drain contact plug. In the ferroelectric memory device of the present invention, the first interconnection is connected to the gate contact pad and the source/drain contact pad with the gate contact plug and the source/drain contact plug respectively in the peripheral circuit region. As a result, the first via hole has a very low aspect ratio as compared with a conventional ferroelectric memory device.

According to another embodiment of the present invention, a bit line and a storage node contact pad are formed on a cell array region of a ferroelectric memory device to respectively connect with a source and a drain of the cell array region, and a first interlayer dielectric layer covers the resulting structure. A bit line is connected to the bit line pad. The bit line extends a predetermined region between the first and second interlayer dielectric layers and is connected to the bit line pad through the first interlayer dielectric layer. A ferroelectric capacitor is arranged between the second and third interlayer dielectric layers. A storage node contact plug is arranged on the storage node contact pad. The storage node contact plug is connected to the storage node contact pad and the ferroelectric capacitor through the first and second interlayer dielectric layers. A plate electrode line is arranged on the fourth interlayer dielectric layer of the ferroelectric capacitor. The plate electrode line is connected to the storage capacitor through the third and fourth interlayer dielectric layers.

According to yet another embodiment, the present invention provides a method of fabricating a ferroelectric memory device having a via hole of low aspect ratio. The method includes forming a transistor on a semiconductor substrate and then covering the transistor with a first interlayer dielectric layer; connecting a source/drain contact pad and gate contact pad with a source/drain and gate electrode of the transistor through the first interlayer dielectric layer; forming a second interlayer dielectric layer overlying the source/drain contact pad and gate contact pad; connecting a source/drain contact plug and a gate contact plug with the source/drain contact pad and the gate contact pad through the second interlayer dielectric layer; forming a third interlayer dielectric layer overlying the source/drain contact plug and the gate contact plug; patterning the third interlayer dielectric layer to form first via holes exposing the source/drain contact plug and the gate contact plug; and forming a first interconnection to extend over a predetermined region of the third interlayer dielectric layer. The first interconnection covers the sidewalls of the first via hole and is selectively connected to the source/drain contact plug and the gate contact plug.

In one aspect of the present invention, the semiconductor substrate includes a cell array region and a peripheral circuit region. At least one cell transistor is arranged in the cell array region and at least one peripheral circuit transistor is arranged in the peripheral circuit region. A bit line pad is formed on the cell source of the cell array region and a storage node contact pad is concurrently formed on a cell drain. A first interlayer dielectric layer is then formed over the bit line pad and storage node contact pad. A bit line is connected to the bit line pad. A gate contact pad and a source/drain contact pad are connected to the gate electrode and the source/drain of the peripheral circuit. A second interlayer dielectric layer is formed over the resulting structure. A storage node contact plug is connected to the storage node contact pad and a gate contact plug and source/drain contact plug are connected to the gate contact pad and source/drain contact pad. A ferroelectric capacitor is formed to be connected to the storage node contact plug on the second interlayer dielectric layer and a third interlayer dielectric layer is formed over the ferroelectric capacitor. The third interlayer dielectric layer is patterned to form first via holes exposing the gate contact plug and the source contact plug.

A first interconnection is formed to extend over a predetermined region of the third interlayer dielectric layer. The first interconnection covers the sidewalls of the first via hole and is selectively connected to the gate contact plug and the source/drain contact plug. Additionally, a fourth interlayer dielectric layer is formed over the resulting structure. A plate electrode line is formed to extend over a predetermined region of the fourth interlayer dielectric layer and to be connected to the ferroelectric capacitor through the third and fourth interlayer dielectric layers. A second interconnection is connected to the first interconnection through the fourth interlayer dielectric layer.

DESCRIPTION OF THE PREFERRED EMBODIMENT

The present invention will now be described more fully with reference to the accompanying drawings, in which preferred embodiments of the invention are shown. This invention may, however, be embodied in different forms and should not be construed as limited to the embodiments set forth here. Rather, these embodiments are provided so that this disclosure will be complete and will fully convey the scope of the invention to those of ordinary skill in the art. In the attached figures, the thickness of layers and regions is exaggerated for clarity. When a layer is said to be on another layer or on a substrate, it is to be understood that the layer may be directly formed on the other layer or on the substrate, or that a third layer may be interposed therebetween. The same reference numbers indicate the same components throughout the specification. Throughout the figures, the reference 'a' indicates a cell array region and the reference 'b' indicates a peripheral circuit region.

Figure 1:
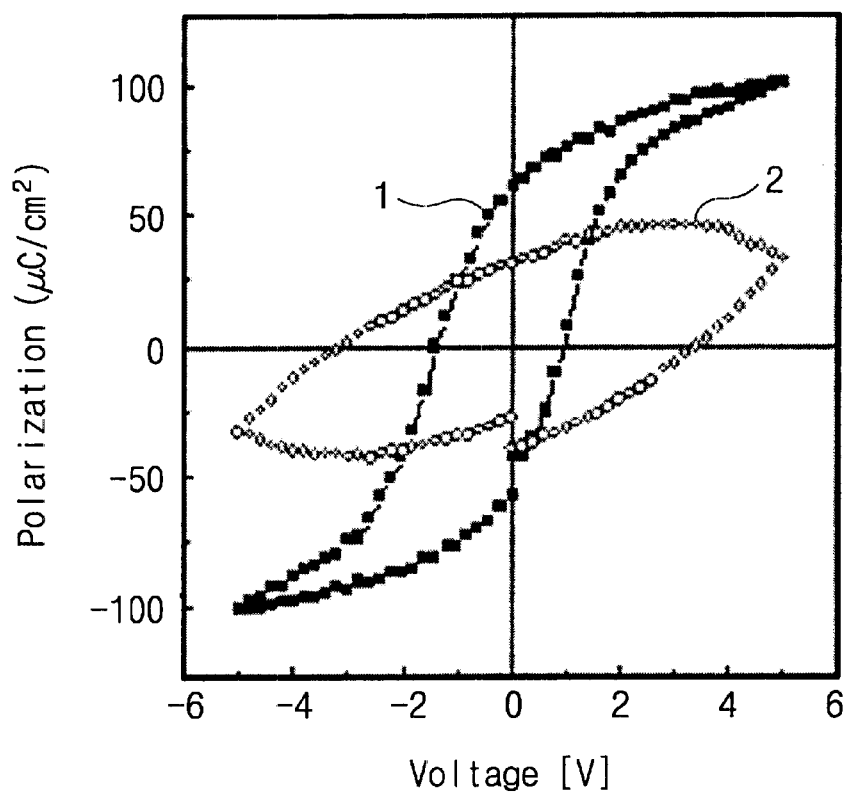
FIG. 1 illustrates a hysteresis graph of a ferroelectric capacitor according to an interconnection process.
Figure 2:
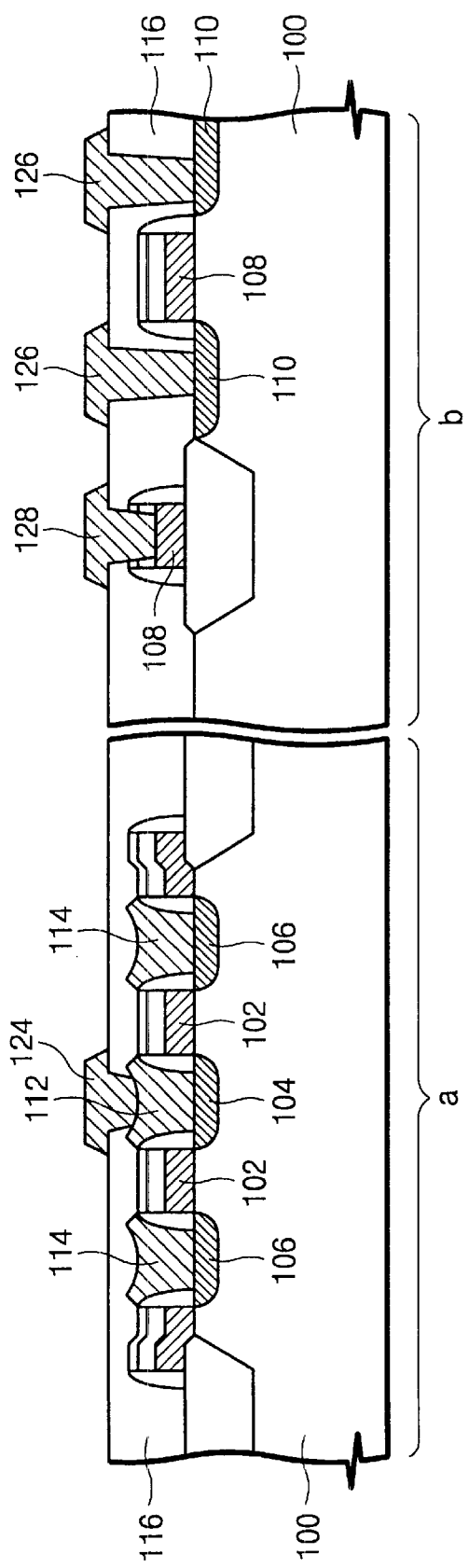
FIG. 2 is a cross-sectional view illustrating a conventional method of fabricating a ferroelectric memory device in which a first interlayer dielectric layer is formed.
Figure 3:
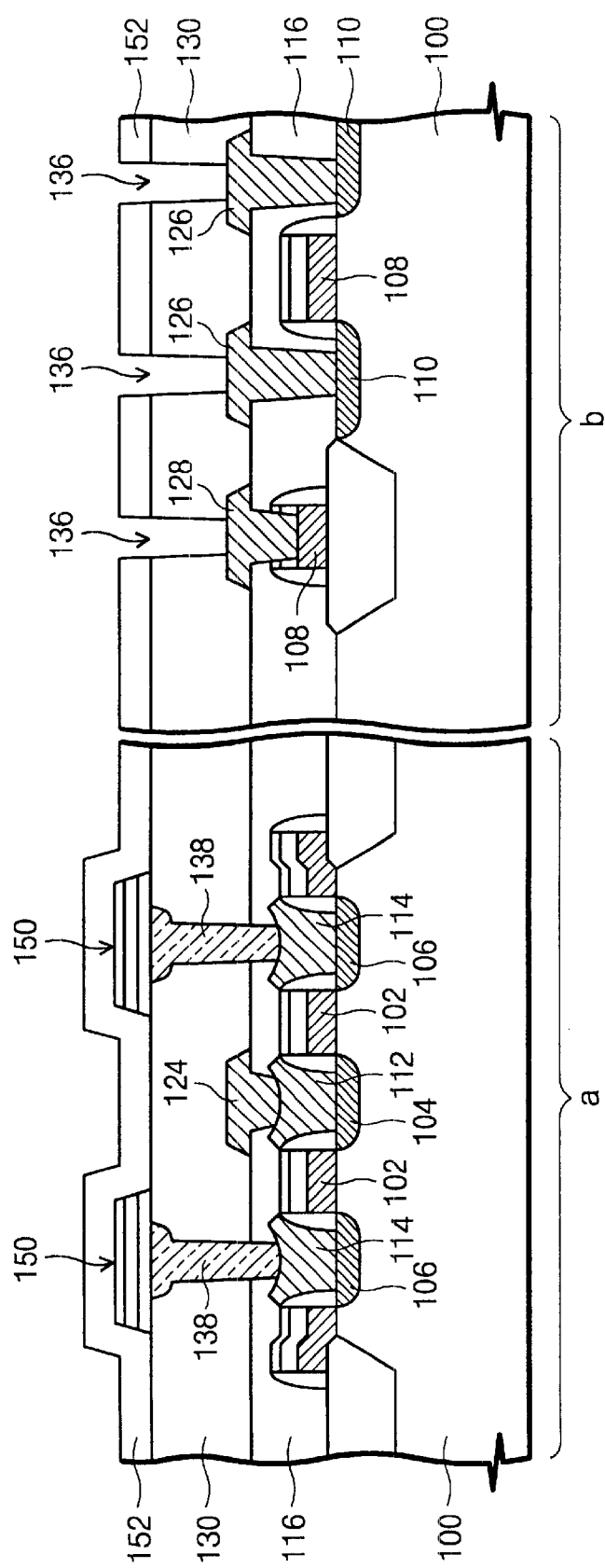
FIG. 3 is a cross-sectional view illustrating a conventional method of fabricating a ferroelectric memory device in which second and third interlayer dielectric layers are formed.
Figure 4:
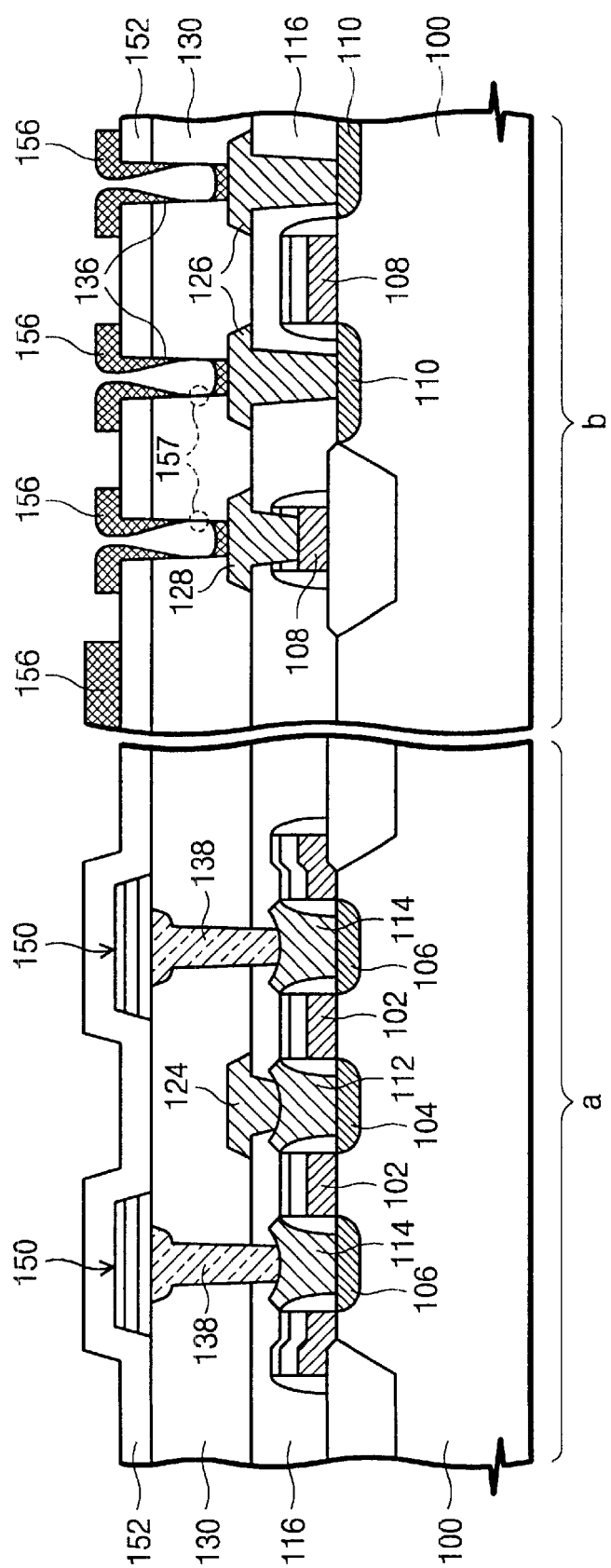
FIG. 4 is a cross-sectional view illustrating a conventional method of fabricating a ferroelectric memory device in which a first conductive layer is formed.
Figure 5:
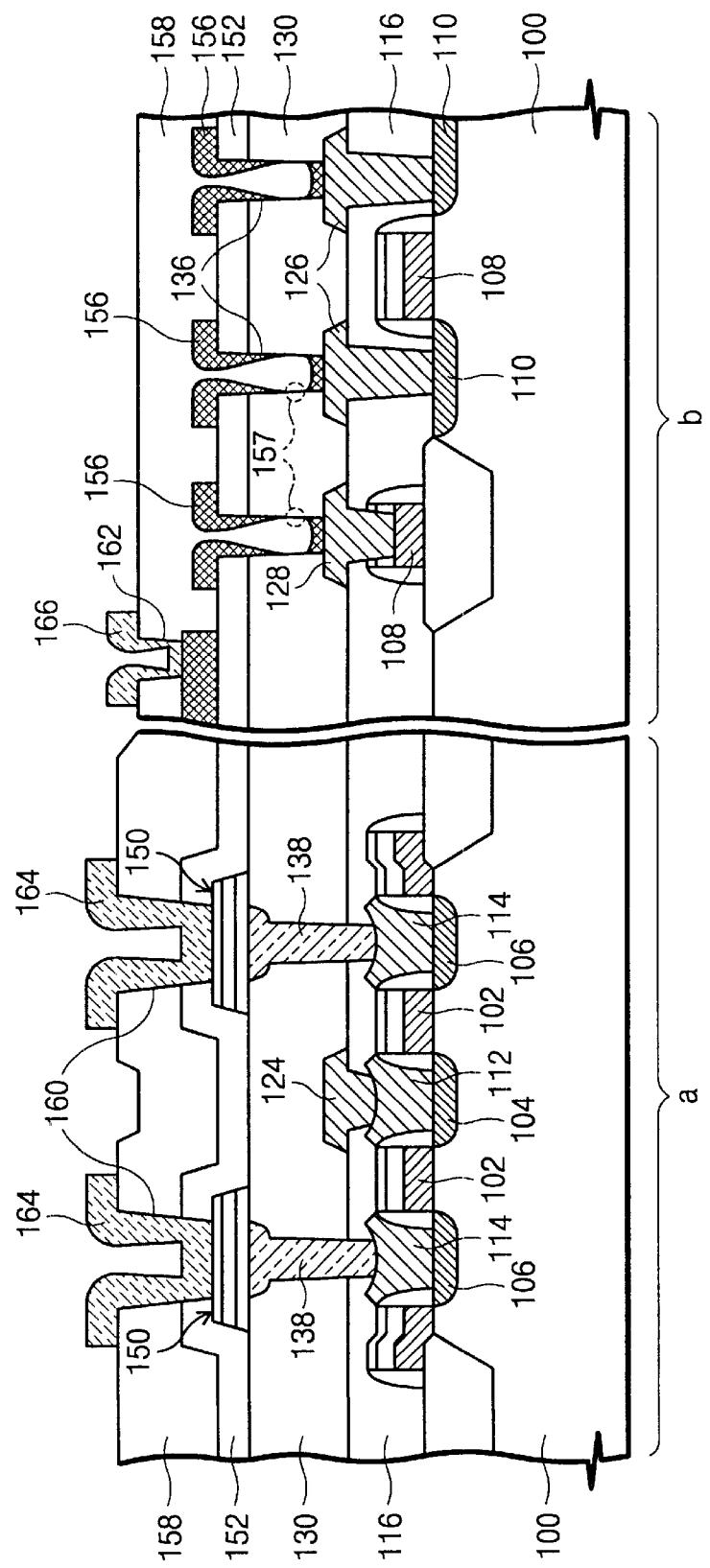
FIG. 5 is a cross-sectional view illustrating a conventional method of fabricating a ferroelectric memory device in which a fourth interlayer dielectric layer is formed.
Figure 6:
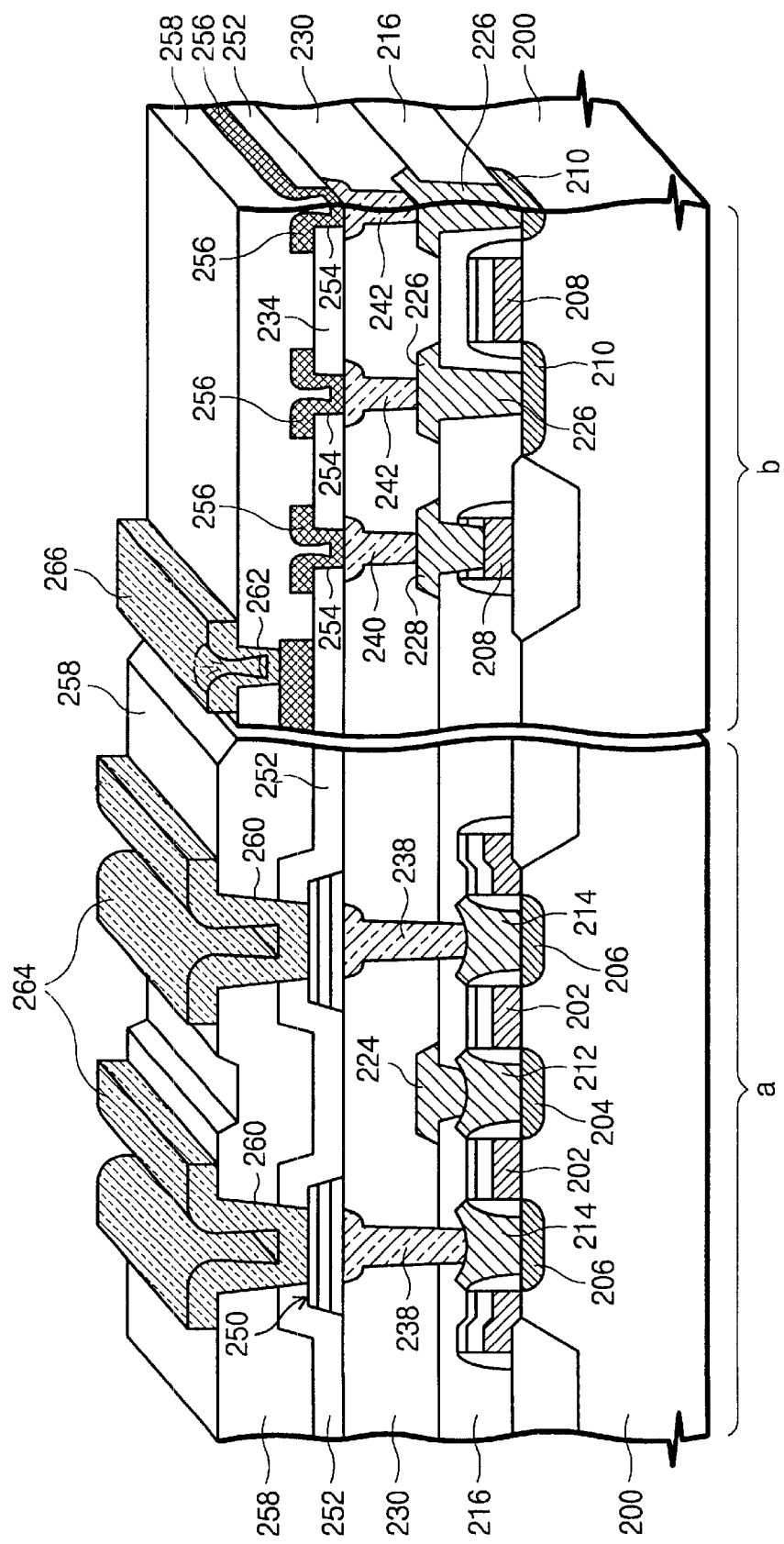
FIG. 6 is an isomeric view illustrating a ferroelectric memory device according to an embodiment of the present invention.

Referring to FIG. 6, a plurality of cell transistors are arranged in the cell array region 'a' of a semiconductor substrate 200 and a plurality of peripheral circuit transistors are arranged in the peripheral circuit region 'b'. A bit line pad 212 and a storage node contact pad 214 are connected to a cell source 206 and a cell drain 204, respectively, between cell gate electrodes 202 of the cell transistors. A first interlayer dielectric layer 216 covers the surface of the substrate 200 where the bit line pad 212 and the storage node contact pad 214 are formed. A bit line 224 is connected to the bit line pad 212 through the first interlayer dielectric layer 216. Additionally, a gate contact pad 228 and a source/drain contact pad 226 are connected to the gate electrode 208 and the source/drain 210 of the peripheral circuit transistors through the first interlayer dielectric layer 216. A cell gate contact pad (not shown) is connected to the cell gate electrode 202 at a desired region of the substrate 200. A second interlayer dielectric layer 230 covers the surface of the first interlayer dielectric layer 216. A gate contact plug 240 and a source/drain contact plug 242 are arranged through the second interlayer dielectric layer 230. The gate contact plug 240 and the source/drain contact plug 242 are connected to the gate contact pad 228 and the source/drain contact pad 226, respectively. A storage node contact plug 238 is arranged in the cell array region 'a' through the first and second interlayer dielectric layers 216, 230. The storage node contact plug 238 is connected to the storage node contact pad 214. A ferroelectric capacitor 250 is arranged on the second interlayer dielectric layer 230 and the ferroelectric capacitor 250 is connected to the storage node contact plug 238. The storage node contact plug 238, the gate contact plug 240 and the source/drain contact plug 242 may have structures in which the top portion is wider than the bottom portion.

A third interlayer dielectric layer 252 covers the surface of the second interlayer dielectric layer 230, and a first interconnection 256 is arranged on the third interlayer dielectric layer 252. First via holes 254 expose the gate contact plug 240 or the source/drain contact plug 242, through the third interlayer dielectric layer 252. The first interconnection 256 is formed, preferably conformably, on the sidewalls of the first via hole 254 and is connected to the gate contact plug 240 and/or the source/drain contact plug 242. The present invention further comprises the gate contact plug 240 and the source/drain contact plug 242 in the peripheral circuit region 'b,' which is different from the conventional technology. Thus, via holes of the ferroelectric memory device according to an embodiment the present invention has a lower aspect ratio than conventional technology.

A fourth interlayer dielectric layer 258 covers the surface of the third interlayer dielectric layer 242 where the first interconnection 256 is arranged. The third and fourth interlayer dielectric layers 252, 258 are sequentially patterned to form a plate electrode hole 260 in the cell array region 'a', and a fourth interlayer dielectric layer 258 is penetrated to form a second via hole exposing the first interconnection in the peripheral circuit region 'b'. A plate electrode line 264 is arranged on a desired region of the fourth interlayer dielectric layer 258. The plate electrode line 264 is formed on the sidewalls of the plate electrode hole 260 and is connected to the ferroelectric capacitor 250. Additionally, a second interconnection 266 is arranged on a desired region of the fourth interlayer dielectric layer 258. The second interconnection 266 is formed, preferably conformally, on the sidewalls of the second via hole 262 and is connected to the first interconnection 256. Although not shown, the first interconnection 256 and the plate electrode line 264 are selectively connected to one another at a desired region of the substrate 200. The second interconnection 266 is preferably a sputter-deposited metal layer to prevent the degradation of a ferroelectric capacitor that occurs with conventional technology.

The process for manufacturing the ferroelectric memory device shown in FIG. 6 in accordance with an embodiment of the present invention is now described with respect to FIGS. 7 through 12.

Figure 7:
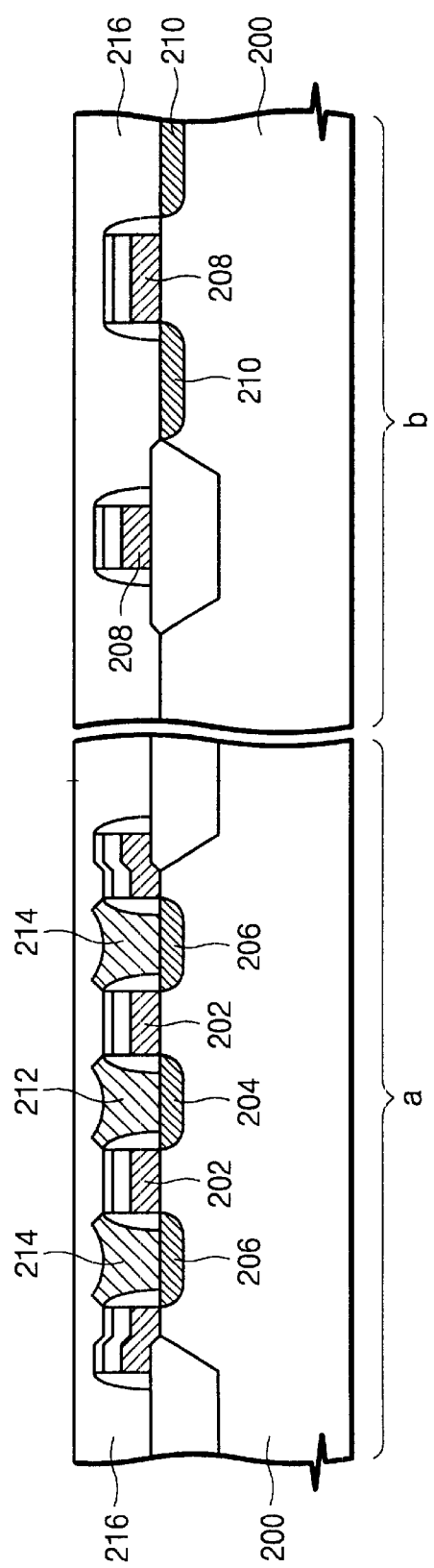
FIG. 7 is a cross-sectional view of a method of fabricating a ferroelectric memory device according to an embodiment of the present invention in which a first interlayer dielectric layer is formed.

Referring to FIG. 7, a plurality of cell transistors having a cell gate electrode 202, a cell source 206, and a cell drain 204 are formed at a cell array region 'a' of a semiconductor substrate 200. Additionally, a plurality of peripheral circuit transistors having a gate electrode 208 and a source/drain 210 are formed at a desired region of a peripheral circuit region 'b'. A bit line contact pad 212 and a storage node contact pad 214 are formed between the cell gate electrodes 202. The bit line contact pad 212 and the storage node contact pad 214 are connected to the cell source 206 and the cell drain 204, respectively. Then, a first interlayer dielectric layer 216 is formed on the resulting structure.

Figure 8:
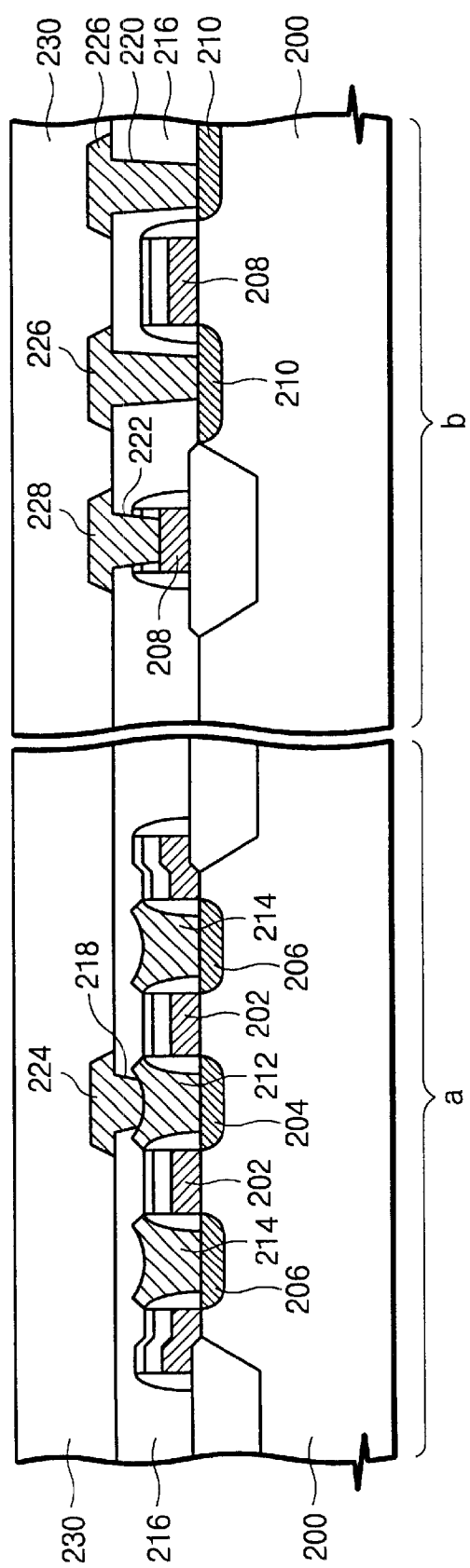
FIG. 8 is a cross-sectional view of a method of fabricating a ferroelectric memory device according to an embodiment of the present invention in which a first conductive layer is formed and patterned.

Referring to FIG. 8, the first interlayer dielectric layer 216 is patterned to form a bit line contact hole 218, a first source/drain contact hole 220, and a first gate contact hole 222, which expose the bit line contact pad 212, the source/drain 210, and the gate electrode 208 of the peripheral circuit transistors. A first conductive layer is then formed on the resulting structure to fill the bit line contact hole 218, the first source/drain contact hole 220, and the first gate contact hole 222. The first conductive layer is preferably formed of a refractory material having superior burial characteristics, e.g., polysilicon, metal silicide or tungsten. The first conductive layer is then patterned using photo-lithography to form a bit line 224 extending over a desired region of the first interlayer dielectric layer 216. The bit line 224 is connected to the bit line pad 212 through the first interlayer dielectric layer 216. A source/drain contact pad 226 and a gate contact pad 228 are concurrently formed to connect with the source/drain 210 and the gate electrode 218, respectively. By using chemical mechanical polishing (CMP), the first conductive layer may be planarized to expose the first interlayer dielectric layer 216 and the bit line 224, the source/drain contact pad 226, and the gate contact pad 228 may be formed.

Figure 9:
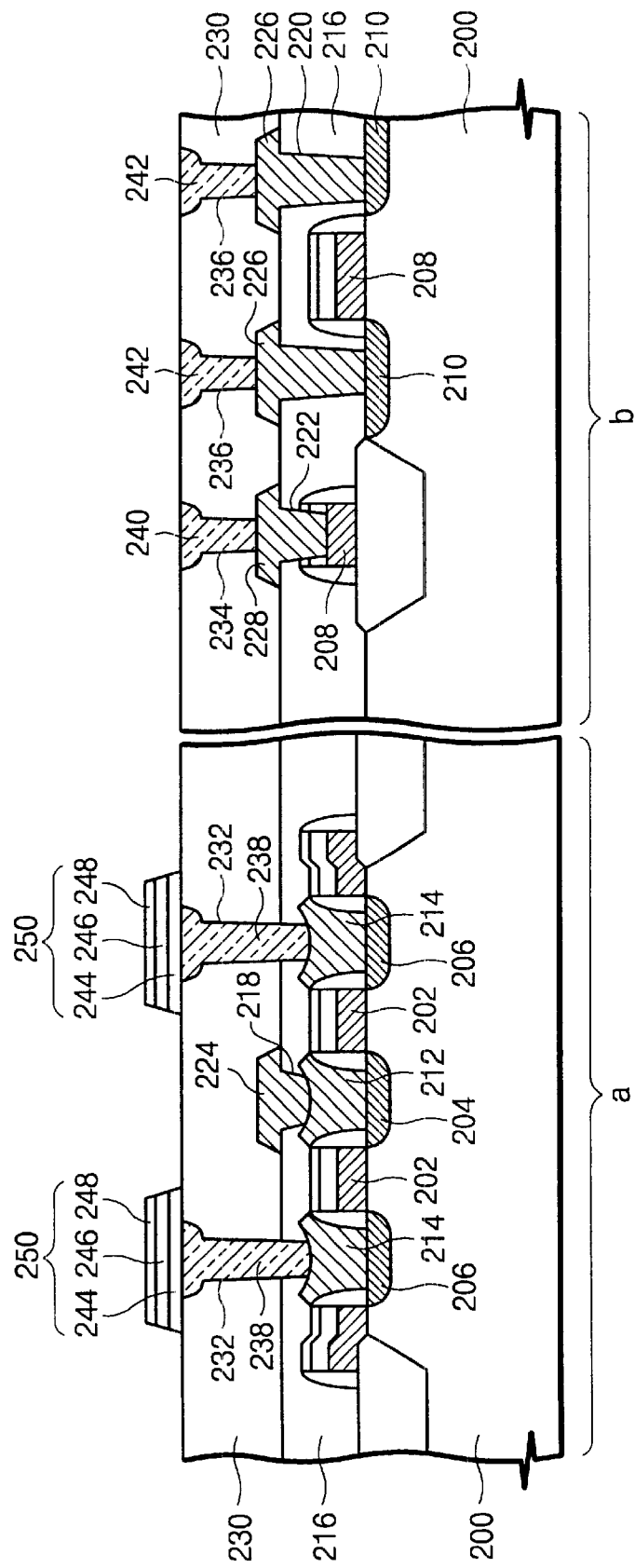
FIG. 9 is a cross-sectional view of a method of fabricating a ferroelectric memory device according to an embodiment of the present invention in which a second interlayer dielectric layer is formed.

Referring to FIG. 9, a second interlayer dielectric layer 230 is formed on the resulting structure. The second interlayer dielectric layer 230 is preferably formed of silicon oxide. The first and second interlayer dielectric layers 216, 230 are then patterned to form a storage node contact hole 232, exposing the storage node contact pad 214, and concurrently to form a second gate contact hole 234 and a second source/drain contact hole 236, exposing the gate contact pad 228 and the source/drain contact pad 226, respectively. During the formation of the storage node contact hole 232, the second gate contact hole 234, and the second source/drain contact hole 236, an isotropic etching process and an anisotropic etching process are sequentially performed to etch the second interlayer dielectric layer 230. The result is that the storage node contact hole 232, the second gate contact hole 234, and the second source/drain contact hole 236 have wider top portions than bottom portions.

Although not shown, the cell gate contact pad connected to the gate electrode may be exposed at a predetermined region of the substrate 200. A second conductive layer is then formed over the surface of the second interlayer dielectric layer 230 to fill the storage node contact hole 232, the second gate contact hole 234, and the second source/drain contact hole 236. Like the first conductive layer, the second conductive layer is preferably formed of a refractory material having superior burial characteristics. The second conductive layer is then planarized using CMP to form a storage node contact plug 238, a gate contact plug 240, and a source/drain contact plug 242 in the storage node contact hole 232, the second gate contact hole 234, and the source/drain contact hole 236, respectively.

The storage node contact plug 238 is connected to the storage node contact pad 214 and the gate contact plug 240 and the source/drain contact plug 242 are connected to the gate contact pad 228 and the source/drain contact pad 226. A lower conductive layer, a ferroelectric layer, and an upper conductive layer are sequentially formed on the second interlayer dielectric layer 230. The lower conductive layer, the ferroelectric layer, and the upper conductive layer are then sequentially patterned to form a ferroelectric capacitor 250 connected to the storage node contact plug 238 on the second interlayer dielectric layer 230. The ferroelectric capacitor 250 includes a lower electrode 244, a ferroelectric layer 246 and an upper electrode 248. A diffusion barrier (not shown) is further formed on the surface of the ferroelectric capacitor 250 to prevent degradation of the ferroelectric capacitor 250 due to the material forming the interlayer dielectric layer.

Figure 10:
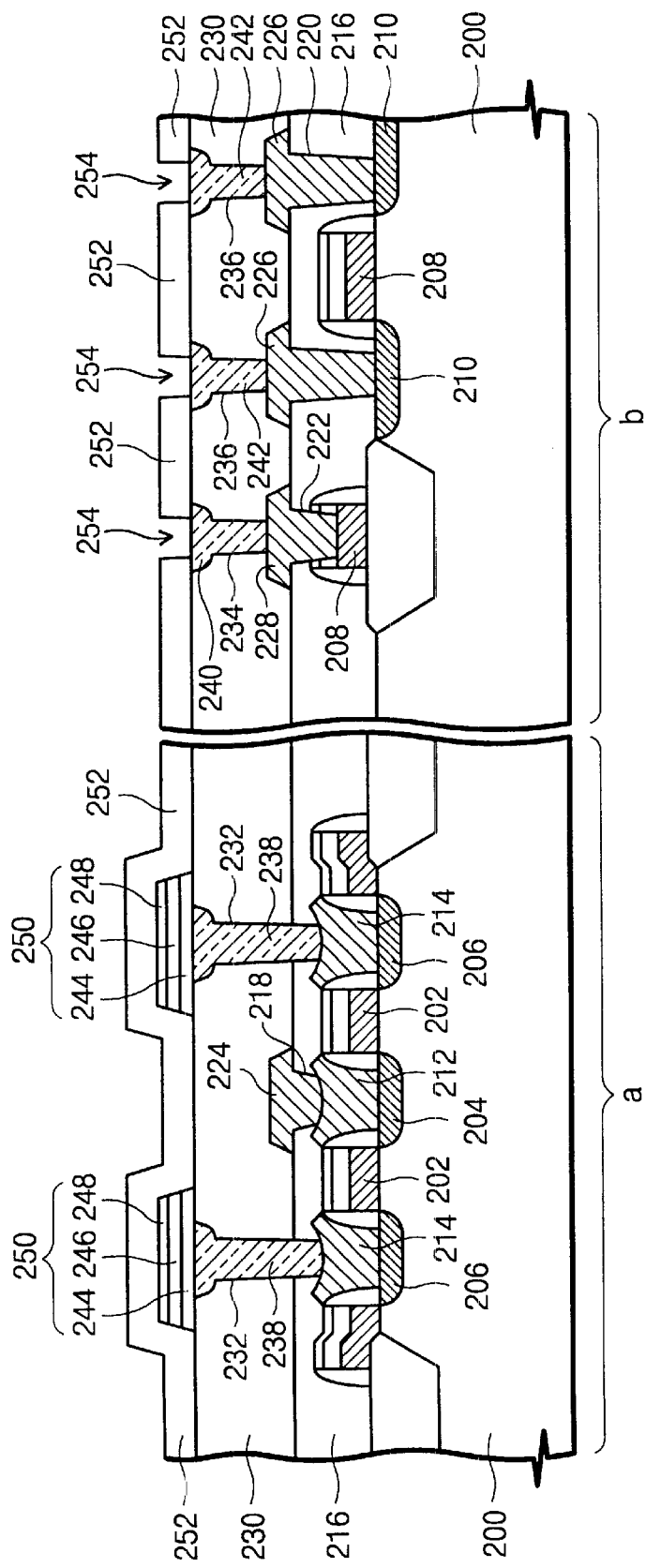
FIG. 10 is a cross-sectional view of a method of fabricating a ferroelectric memory device according to an embodiment of the present invention in which a third interlayer dielectric layer is formed and patterned.

Referring to FIG. 10, a third interlayer dielectric layer 252 is formed on the resulting structure. The third interlayer dielectric layer 252 is then patterned to form first via holes 254 exposing the gate contact plug 240 and the source/drain contact plug 242.

Figure 11:
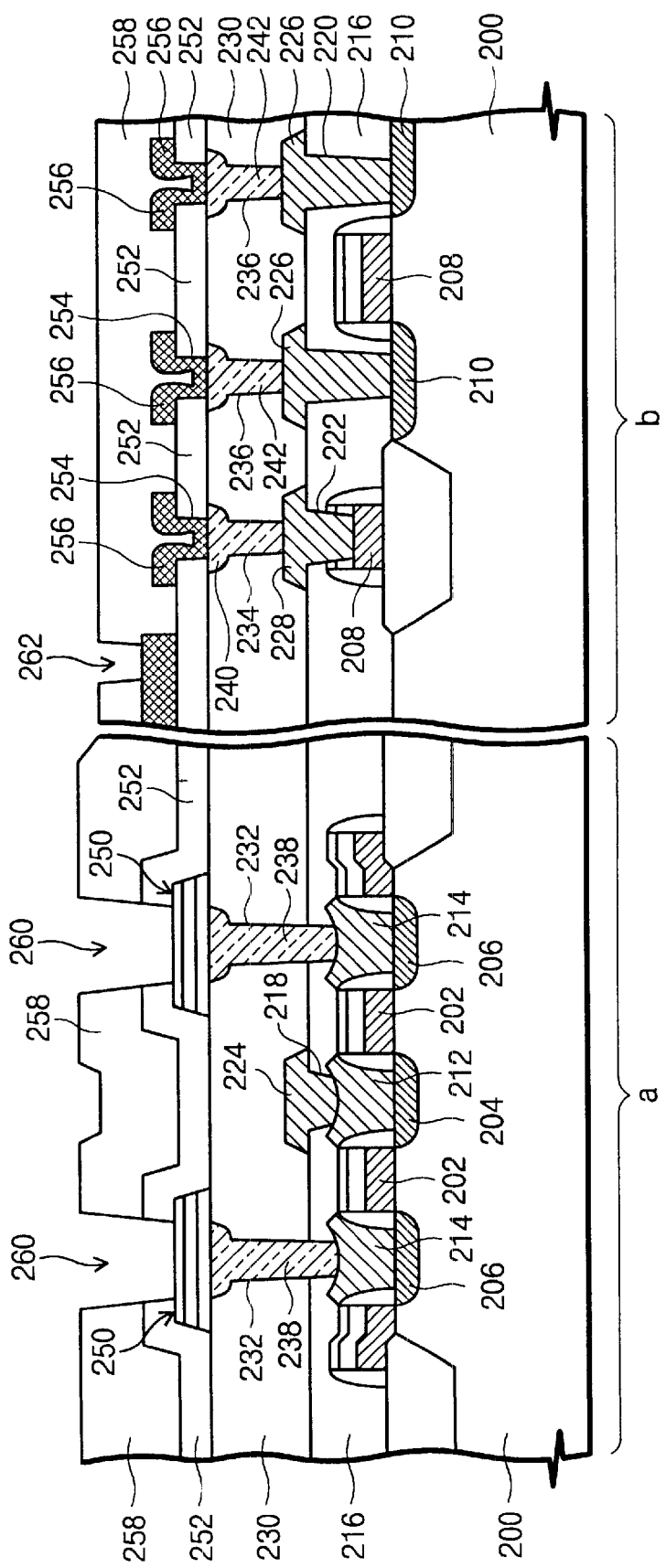
FIG. 11 is a cross-sectional view of a method of fabricating a ferroelectric memory device according to an embodiment of the present invention in which a third interlayer dielectric layer is formed and patterned.

Referring to FIG. 11, a third conductive layer is formed on the third interlayer dielectric layer 252 to fill the first via hole 254. The third conductive layer is preferably formed of a sputter-deposited metal. The third conductive layer may, among other metals, be formed of aluminum or copper. In the present invention, the first via hole 254 has a low aspect ratio. After deposition using sputtering deposition without reflow by thermal treatment, a metal layer may be uniformly deposited on the sidewalls of the first via hole 254. Thus, it is possible to prevent degradation by stress at the ferroelectric capacitor 250 and concurrently to form a metal interconnection having superior reliability.

The third conductive layer is subsequently patterned to form a first interconnection 256 extending over a desired region of the third interlayer dielectric layer 252. The first interconnection 256 covers, preferably conformally, the sidewalls of the first via hole 254 and is selectively connected to the gate contact plug 240 and the source/drain contact plug 242. A fourth interlayer dielectric layer 258 is formed on the resulting structure where the first interconnection 256 is formed. The third and fourth interlayer dielectric layers 252, 258 are patterned to form a plate electrode hole 260 exposing the ferroelectric capacitor 250 and concurrently to form a second via hole 262 exposing the first interconnection 256. The plate electrode hole 260 may be groove-shaped, thereby increasing an exposed area of the ferroelectric capacitor 250.

Figure 12:
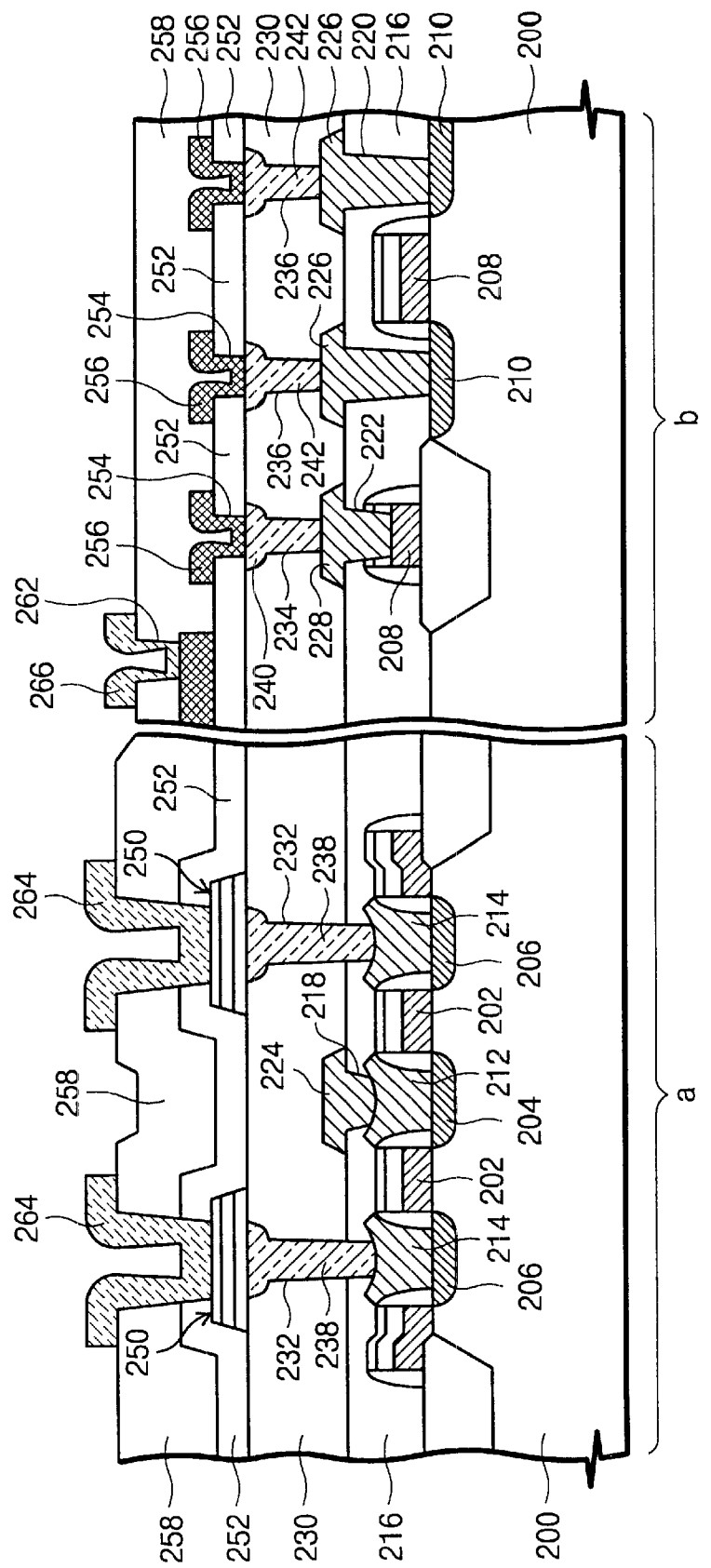
FIG. 12 is a cross-sectional view of a method of fabricating a ferroelectric memory device according to an embodiment of the present invention in which a fourth conductive layer is formed.

Referring to FIG. 12, a fourth conductive layer is formed on the resulting structure where the second via hole 262 and the plate electrode hole 260 are formed to fill the second via hole 262 and the plate electrode hole 260. Like the third conductive layer, the fourth conductive layer is also preferably formed of a sputter-deposited metal to prevent degradation of the ferroelectric capacitor 250. Since the second via hole 262 and the plate electrode hole 260 also have a low aspect ratio, a metal layer may be uniformly deposited on the sidewalls of the second via hole 262 and the plate electrode hole 260. The fourth conductive layer is then patterned to form a plate electrode line 264 connected to the ferroelectric capacitor 250 at a predetermined region of the fourth interlayer dielectric layer 258 and, concurrently, to form a second interconnection 266 connected to the first interconnection 256. Although not shown, the second interconnection 266 and the plate electrode line 264 are connected to a desired region of the semiconductor substrate 200.

According to the present invention, as described above, a via hole of low aspect ratio may be formed. When a sputter-deposited metal layer is formed in the absence of reflow by thermal treatment, a uniformly deposited metal layer may be formed on the sidewalls of the via hole. Therefore, it is possible to improve the polarization of a ferroelectric capacitor, and improve the conductivity and reliability of metal interconnects.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:
1. A ferroelectric memory device comprising:
   a semiconductor substrate having a cell array region where at least one cell transistor is arranged and a peripheral circuit region where at least one peripheral circuit transistor is arranged;

first, second, third, and fourth interlayer dielectric layers sequentially stacked on the cell array and peripheral circuit regions;

a gate contact pad and source/drain contact pad respectively connected to a gate electrode and a source/drain of the peripheral circuit transistor through the first interlayer dielectric layer;

a gate contact plug and source/drain contact plug respectively connected to the gate contact pad and the source/drain contact pad through the second interlayer dielectric layer;

first via holes exposing the gate contact plug and the source contact plug through the third interlayer dielectric layer; and a first interconnection extending between the third and fourth interlayer dielectric layers, covering the sidewalls of the first via holes and being connected to at least one of the gate contact plug and the source/drain contact plug, wherein the first interconnection comprises a portion having a uniform thickness extending between the sidewall and a central opening in each first via hole.

2. The ferroelectric memory device of claim 1, further comprising: a second interconnection extending a region of the fourth interlayer dielectric layer and being connected to the first interconnection through the fourth interlayer dielectric layer.

3. The ferroelectric memory device of claim 1, wherein the source/drain contact plug and the gate contact plug have structures in which the top portion is wider than the bottom portion.

4. The ferroelectric memory device of claim 1, wherein the first interconnection is formed of sputter-deposited aluminum.

5. The ferroelectric memory device of claim 2, wherein the second interconnection is formed of sputter-deposited aluminum.

6. The ferroelectric memory device of claim 1, further comprising:

a bit line pad and a storage node contact pad respectively connected to a source and a drain of the cell transistor in the first interlayer dielectric layer;

a bit line extending between the first interlayer dielectric layer and the second interlayer dielectric layer, wherein the bit line is connected to the bit line pad through the first interlayer dielectric layer;

a storage capacitor located over the storage node contact pad and interposed between the second interlayer dielectric layer and the third interlayer dielectric layer;

a storage node contact lug connected to the storage capacitor and the storage node contact pad through the first interlayer dielectric layer and the second interlayer dielectric layer; and a plate electrode line extending a region of the fourth interlayer dielectric layer and being connected to the storage capacitor through the third interlayer dielectric layer and the fourth interlayer dielectric layer.

7. The ferroelectric memory device of claim 6, further comprising a plate electrode hole exposing the storage capacitor through the third interlayer dielectric layer and the fourth interlayer dielectric layer, wherein the plate electrode line is formed on the sidewalls of the plate electrode hole and is connected to the storage capacitor.

8. The ferroelectric memory device of claim 6, wherein the plate electrode line is formed of a sputter-deposited metal.

9. The ferroelectric memory device of claim 6, wherein the storage node contact plug has a structure in which the top portion is wider than the bottom portion.

10. A ferroelectric memory device comprising:

a semiconductor substrate having a cell array region where at least one cell transistor is arranged and a peripheral circuit region where at least one peripheral circuit transistor is arranged;

first, second, third, and fourth interlayer dielectric layers formed on the cell array and peripheral circuit regions;

a gate contact pad and source/drain contact pad respectively connected to a gate electrode and a source/drain o the peripheral circuit transistor through the first interlayer dielectric layer;

a gate contact plug and a source/drain contact plug respectively connected to the gate contact pad and the source/drain contact pad through the second interlayer dielectric layer;

first via holes exposing the gate contact plug and the source contact plug through the third interlayer dielectric layer and a first interconnection formed over a region of the third interlayer dielectric layer and disposed over at least one of the gate contact plug and the source/drain contact plug, wherein the first interconnection is formed on the sidewalls of the first via holes and wherein the first interconnection is formed of a non-reflowable material and comprises a portion having a uniform thickness formed on sidewalls of the first via holes.

11. The ferroelectric memory device of claim 10, wherein the ferroelectric memory device further comprises a second interconnection extending a region of the fourth interlayer dielectric layer and being connected to the first interconnection through the fourth interlayer dielectric layer.

12. The ferroelectric memory device of claim 10, wherein the source/drain contact plug and the gate contact plug have structures in which the top portion is wider than the bottom portion.

13. The ferroelectric memory device of claim 10, wherein the first interconnection conformally covers the sidewalls of the first via holes.

14. The ferroelectric memory device of claim 1, wherein the first interconnection is formed of a non-reflowable material.

* * * * *

UNITED STATES PATENT AND TRADEMARK OFFICE
CERTIFICATE OF CORRECTION

PATENT NO. : 6,649,955 B2  
DATED : November 18, 2003  
INVENTOR(S) : Lee

It is certified that error appears in the above-identified patent and that said Letters Patent is hereby corrected as shown below:

<u>Title page, Item 54 and Column 1, line 1,</u>
Totle, "FERROELECTRIC MEMORY DEVICE AND METHOD OF FABRICATING THE SAME" should read -- FERROMAGNETIC MEMORY DEVICE --

<u>Column 2,</u>
Line 23, "has high aspect" should read -- has a high aspect --.

<u>Column 9,</u>
Line 52, "contact lug connected" should read -- contact plug connected --.

<u>Column 10,</u>
Line 22, "and source/drain" should read -- and a source/drain --.
Line 24, "source/drain o the" should read -- source/drain of the --.
Line 33, "layer and" should read -- layer; and --.
Line 39, "via holes and" should read -- via holes, and --.

Signed and Sealed this

Thirteenth Day of July, 2004

JON W. DUDAS  
*Acting Director of the United States Patent and Trademark Office*